(12) United States Patent
Watanabe et al.

(10) Patent No.: US 8,569,707 B2
(45) Date of Patent: Oct. 29, 2013

(54) RADIATION DETECTION APPARATUS AND RADIATION DETECTION SYSTEM

(75) Inventors: Minoru Watanabe, Honjo (JP); Chiori Mochizuki, Sagamihara (JP); Keigo Yokoyama, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 30 days.

(21) Appl. No.: 13/296,053

(22) Filed: Nov. 14, 2011

(65) Prior Publication Data
US 2012/0126128 A1    May 24, 2012

(30) Foreign Application Priority Data
Nov. 22, 2010  (JP) ................... 2010-260523

(51) Int. Cl.
*G01T 1/20*    (2006.01)
(52) U.S. Cl.
USPC ........................................................ 250/369
(58) Field of Classification Search
USPC ............... 250/369, 370.01–370.15; 378/98.8
See application file for complete search history.

(56) References Cited

U.S. PATENT DOCUMENTS

| 5,801,385 A * | 9/1998 | Endo et al. ............... 250/370.11 |
| 6,895,077 B2 * | 5/2005 | Karellas et al. ............. 378/98.3 |
| 7,634,060 B2 * | 12/2009 | Hoffman et al. ............. 378/98.8 |
| 2009/0050817 A1 * | 2/2009 | Horiuchi .................. 250/370.11 |

FOREIGN PATENT DOCUMENTS

JP    07-027864 A    1/1995

* cited by examiner

*Primary Examiner* — Kiho Kim
(74) *Attorney, Agent, or Firm* — Canon USA Inc IP Division (57) ABSTRACT

A radiation detection apparatus includes a scintillator, a photoelectric conversion unit, and a grid for removing scattered radiation. The photoelectric conversion unit includes a plurality of pixels arranged in a two-dimensional array on a substrate. Each pixel is configured to convert visible light output from the scintillator into an electric signal. The grid, the substrate, the photoelectric conversion unit, and the scintillator are disposed in this order from a radiation-incident side of the radiation detection apparatus to an opposite side thereof. In this radiation detection apparatus in which the scintillator is disposed on the side opposite to the radiation-incident side, scattered radiation is effectively removed.

7 Claims, 8 Drawing Sheets

RADIATION DETECTION APPARATUS AND RADIATION DETECTION SYSTEM

BACKGROUND OF THE INVENTION

1. Field of the Invention

The present invention relates to a radiation detection apparatus and a radiation detection system applicable to a medical imaging apparatus, a non-destructive testing apparatus, an analysis apparatus using radiation, or the like.

2. Description of the Related Art

In recent years, thin-film semiconductor production technology has been used in the fabrication of a detection apparatus or a radiation detection apparatus realized by a combination of a switch element such as a TFT (Thin-Film Transistor) and a conversion element such as a photoelectric conversion element. Japanese Patent application Laid-Open No. 07-027864 discloses a radiation detection apparatus in which a solid-state photodetector is disposed on a side on which an X-ray emitted by an X-ray source is incident, and a scintillator is disposed on an opposite side. One of the problems in radiation detection apparatuses, in which the scintillator is disposed on a side opposite to the radiation-incident side, is that the radiation incident on the photodetector undergoes significant scattering. One approach for reducing scattering has been to use a radiation mask or an anti-scatter grid located between the photodetector and the X-ray source. However, the use of an external mask or grid attenuates the level of radiation incident on the photodetector. Another solution for reducing scattering of radiation has been to fabricate a photodetector with a built-in anti-scattering grid. However, it is difficult to determine the position of the grid. Moreover, Japanese Patent application Laid-Open No. 07-027864 does not disclose a location at which a grid for enhancing image sharpness is disposed, although the location of the grid is to be properly determined to handle scattered radiation.

SUMMARY OF THE INVENTION

In view of the above, the present invention provides a technique for effectively removing scattered radiation in a radiation detection apparatus in which a scintillator is disposed on a side opposite to a radiation-incident side of a photodetector. In an aspect of the present invention, a radiation detection apparatus includes a scintillator configured to convert incident radiation into visible light, a photoelectric conversion unit including a plurality of pixels arranged in a two-dimensional array on a substrate, each pixel configured to convert visible light, converted from the incident radiation by the scintillator, into an electric signal, and an anti-scatter grid including radiation-absorptive members and radiation-transmissive members arranged alternately. The grid, the substrate, the photoelectric conversion unit, and the scintillator are disposed in this order from a radiation-incident side of the radiation detection apparatus to an opposite side.

Thus, in the radiation detection apparatus in which the scintillator is disposed on the side opposite to the radiation-incident side of the photodetector configured in the above-described manner, the scattered radiation is effectively removed.

Further features of the present invention will become apparent from the following description of exemplary embodiments with reference to the attached drawings.

DESCRIPTION OF THE EMBODIMENTS

The present invention is described in further detail below with reference to embodiments in conjunction with the accompanying drawings. In the present description, the term "radiation" is used to describe various kinds of radiation including particle beams such as an alpha ray, a beta ray, a gamma ray, etc., radiated via radioactive decay, and other beams with high energy similar to that of particle beams. For example, an X-ray, a cosmic ray, etc., fall under the scope of radiation as used in the present application.

First Embodiment

Figure 1A:
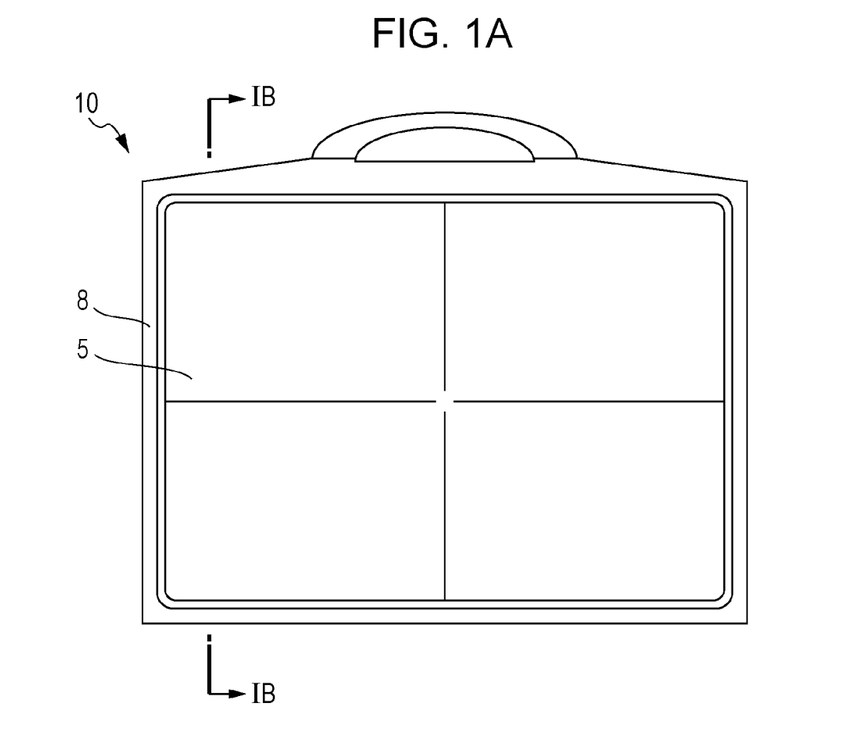
FIGS. 1A and 1B are a plan view and a cross-sectional view of a radiation detection apparatus according to an embodiment of the present invention.
Figure 1B:
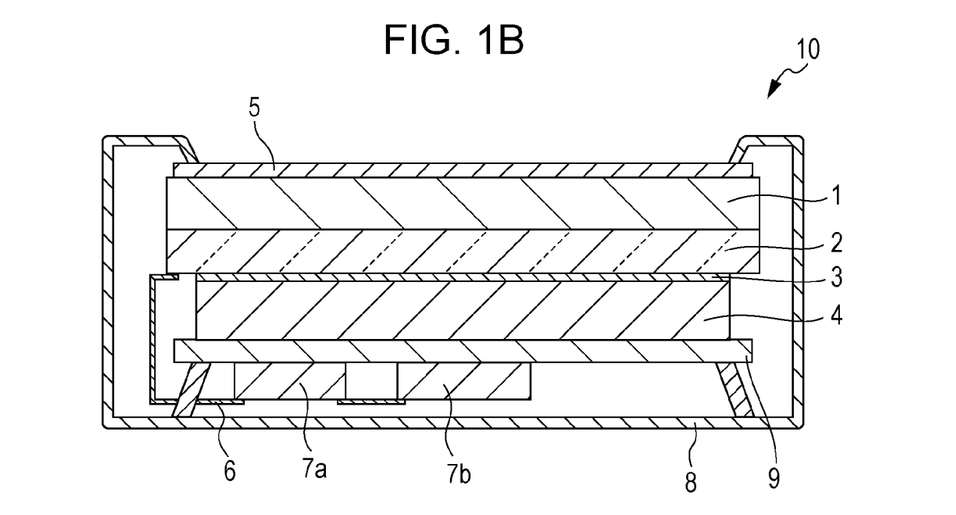

First, referring to FIG. 1A and FIG. 1B, a radiation detection apparatus according to a first embodiment of the present invention is described below. FIGS. 1A and 1B are respectively a plan view and a cross-sectional view (along section marks IB-IB) of a radiation detection apparatus 10. In the radiation detection apparatus 10, a photoelectric conversion unit 3 is disposed on a side of a first surface of a substrate 2 such as a glass substrate with an insulating surface. The photoelectric conversion unit 3 includes a plurality of pixels arranged in a two-dimensional array for converting visible light, obtained by conversion performed by a scintillator 4 described below, into an electric signal. Each pixel includes a photoelectric conversion element and a switch element. Note that the substrate 2 and the photoelectric conversion unit 3 are placed such that radiation is incident on the substrate 2 from a second surface side, opposing the first surface side, of the substrate 2. Hereinafter, for each element, a surface thereof on which radiation is incident will be referred to as a second surface, while a surface opposite to the second surface will be referred to as a first surface.

Printed circuit boards 7a and 7b are connected to an end of the first surface of the substrate 2 via a flexible wiring board 6. Various integrated circuits are mounted on the flexible wiring board and the printed circuit boards. The integrated circuits include, for example, a driving circuit for driving the photoelectric conversion unit 3, a reading circuit for reading the electric signal from the photoelectric conversion unit 3, a power supply circuit for supplying electric power to at least one of the driving circuit and the reading circuit, and a control circuit for controlling at least one of the driving circuit and the reading circuit, etc.

The scintillator 4 is firmly disposed on the first surface, opposite to the surface on which radiation is incident, of the photoelectric conversion unit 3. More specifically, the second surface of the scintillator 4 is firmly connected to the first surface of the photoelectric conversion unit 3 by evaporation or bonding. The first surface of the scintillator 4 is fixed, via an adhesive, a mordant, a shock absorber, or the like, to the second surface of the support base 9 disposed in an enclosure case 8.

The printed circuit boards 7a and 7b are disposed on the side of the first surface of a support base 9. A grid 1 for removing scattered radiation (also referred to simply as an anti-scatter grid 1) is placed in contact with the second surface of the substrate 2 or firmly connected to the second surface of the substrate 2 via an adhesive or the like. That is, the grid 1 is in close contact with the second surface of the substrate 2. Thus, in the radiation detection apparatus configured in the above-described manner according to the present embodiment of the invention, the elements are located in the order the grid 1, the photoelectric conversion unit 3, and the scintillator 4 from the radiation-incident side to the opposite side of the radiation detection apparatus.

On the radiation-incident side of the enclosure case 8, there is disposed a cover 5 capable of allowing radiation to easily pass therethrough and providing high water resistance and high airtightness such that a housing is formed by the enclosure case 8 and the cover 5. In the housing formed by the enclosure case 8 and the cover 5, there are disposed the grid 1, the substrate 2, the photoelectric conversion unit 3, the scintillator 4, the flexible wiring board 6, and the printed circuit boards 7a and 7b in such a manner that they are firmly attached to the support base 9.

The printed circuit boards 7a and 7b are disposed on the side of the second surface of the support base 7. This reduces a bad influence of the radiation on the integrated circuits. By employing the above configuration, it becomes possible to remove scattered radiation by the grid 1 when the radiation is incident. Furthermore, in this configuration, when the scintillator 4 receives radiation passing through the substrate 2 and emits light in response to thereto, the scintillator 4 absorbs a greater amount of radiation and emits a greater amount of light on its side closer to the photoelectric conversion unit 3 than on its opposite side. This results in an increase in the amount of visible light absorbable by the photoelectric conversion unit 3, which allows an increase in sensitivity. Furthermore, in the present configuration, the scintillator 4 emits light at a position close to the photoelectric conversion unit 3, and thus it is possible to reduce an influence of scatter of visible light, which results in an increase in MTF (Modulation Transfer Function).

After the scattered radiation passing through the grid 1 is removed, the radiation can include non-linear radiation influenced by the scatter. Therefore, if the distance between the grid 1 and the scintillator 4 is large, a shift can occur between a location on the grid 1 on which the radiation is incident and a location of the scintillator 4 on which the radiation is incident. This shift can generate a blur in an image read by the image pickup apparatus, which results in a reduction in MTF.

In the present embodiment, because the grid 1 is disposed in close contact with the second surface of the substrate 2, the distance between the grid 1 and the scintillator 4 has a small value given by the sum of the thickness of the substrate 2 and the thickness of the photoelectric conversion unit 3. By placing the grid 1 and the scintillator 4 close to each other in the above-described manner, it becomes possible to prevent the MTF from being reduced by a scattered component of the radiation passing through the grid 1.

In some cases, the grid 1 is configured to be movable to prevent a fixed pattern from being generated by the grid 1 located at a fixed position. In the configuration according to the present embodiment of the invention, because the grid 1 is in contact, at least partially, with the second surface of the substrate 2, it is impossible to move the grid 1 during an image capturing operation. Therefore, in a case where a generation of a fixed pattern can result in a problem, the fixed pattern may be removed, for example, by processing the image.

The substrate 2 may be realized using a material that is rigid and resistant to a high processing temperature at which the photoelectric conversion unit 3 is formed. For example, a glass substrate, a silicon substrate, a hard carbon substrate, etc., may be employed as the substrate 2. The substrate 2 may be formed such that an insulating film made of an organic or inorganic material is disposed on the surface of a substrate material. The insulating film may be a silicon oxide film or a silicon nitride film with high hardness and slipperiness, an insulating film made of a soft organic material such as PET (polyethylene terephthalate) or PI (polyimide), etc.

After the photoelectric conversion unit 3 is formed, the radiation-incident surface of the substrate material may be etched or subjected to a CMP (Chemical Mechanical Polishing) process such that the substrate 2 has a proper thickness and has a proper form on the second surface. By employing the substrate 2 subjected to the thinning process, it becomes possible to reduce the amount of radiation absorbed by the substrate 2, which can result in an increase in sensitivity.

In the case where the substrate 2 subjected to the thinning process is used, the rigidity of the substrate 2 may be achieved by a combination with the grid 1. In this case, to allow the radiation detection apparatus to be used in various applications, the grid 1 with a high grid density and a high grid ratio may be employed, and a proper image processing may be performed.

Furthermore, when the substrate material is subjected to the thinning process, the first surface of the scintillator 4 may be covered with a protective element. In a case where a fluorescent-particle layer such as Gd2O2S:Tb is used as a fluorescent layer of the scintillator 4, if no protective element is used there is a possibility that a vibration applied to the fluorescent layer can destroy the shape thereof. This is also true when an alkali halide columnar crystal structure such as CsI:Tl or CsI:Na is used as the fluorescent layer. To avoid such a problem, the first surface of the scintillator 4 opposite to the second surface of the substrate 2 may be covered with a proper protective element.

The protective element may also be subjected to the thinning process. As for the protective element, the same material as that of the substrate 2 may be used. Alternatively, a material harder than that of the substrate 2 may be used and it may be used as a part of the support base 9. In this case, the first surface of the substrate 2 and the edge of the protective element may be encapsulated with a resin or the like.

Figure 2A:
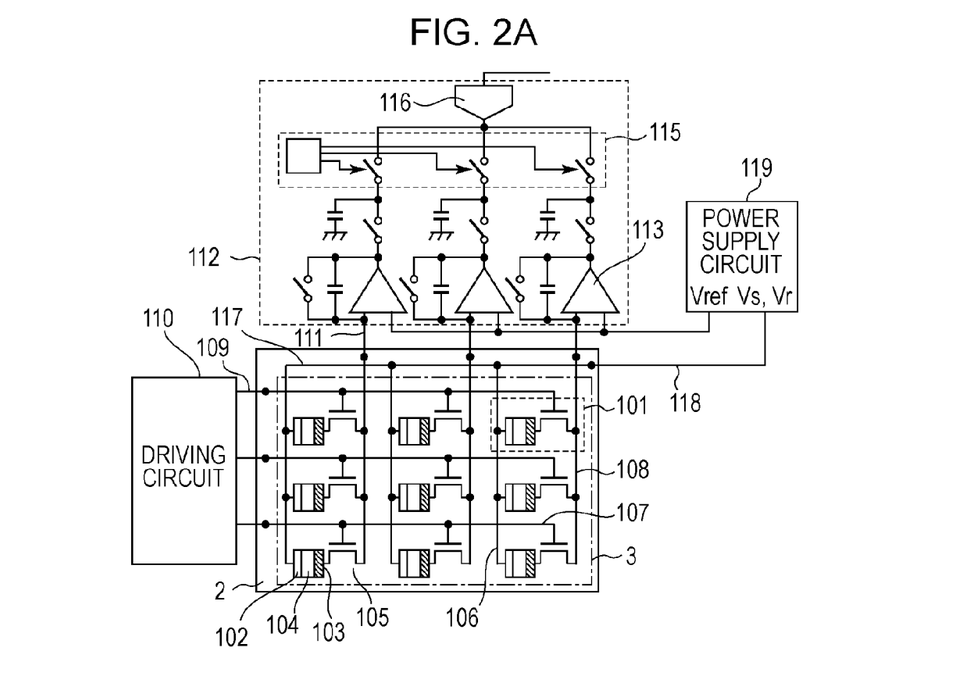
FIGS. 2A and 2B are an equivalent circuit diagram of a radiation detection apparatus and a cross-sectional view of one pixel thereof according to an embodiment of the present invention.

Next, referring to FIG. 2A, an equivalent circuit of the radiation detection apparatus according to the present embodiment of the invention is described below. In the radiation detection apparatus according to the present embodiment of the invention, the photoelectric conversion unit 3 including the plurality of pixels 101 arranged in the form of an array including rows and columns is disposed on the first surface of the substrate 2.

Each pixel 101 includes a photoelectric conversion element 104 that converts radiation or light into an electric charge, and a switch element 105 that outputs an electric signal corresponding to the electric charge of the photoelectric conversion element 104. In the present embodiment, a MIS-type photoelectric conversion element is used as each photoelectric conversion element, and a thin film transistor (TFT) is used as each switch element. The scintillator 4 for converting radiation into visible light detectable by the photoelectric conversion element may be disposed on the radiation-incident side of the photoelectric conversion element. A first electrode 103 of each photoelectric conversion element 104 is electrically connected to a first main electrode of a corresponding one of the switch elements 105, and a second electrode 102 of the conversion element 104 is electrically connected to one of bias lines 106. Each bias line 106 is connected in common to second electrodes 102 of photoelectric conversion elements 104 arranged in a corresponding one of columns. A control electrode of each switch element 105 is electrically connected to one of driving lines 107, and a second main electrode of the switch element 105 is electrically connected to one of signal lines 108. Each driving line 107 is connected in common to control electrodes of switch elements 105 arranged in a corresponding one of rows and also electrically connected to a driving circuit 110 via a corresponding one of first interconnection wirings 109. The driving circuit 110 is configured to sequentially or simultaneously supply driving pulses to a plurality of driving lines 107 arranged in the column direction whereby electric signals are output from pixels in units of rows in parallel to a plurality of signal lines 108 arranged in the row direction. Each signal line 108 is electrically connected in common to the second main electrodes of a plurality of switch elements 105 arranged in the column direction, and is also electrically connected to a reading circuit 112 via a second connection line 111.

The reading circuit 112 includes integrating amplifiers 113 provided for the respective signal lines 108 and configured to provide an integrated and amplified value of the electric signals received via the signal lines 108, and sample-and-hold circuits configured to sample and hold the amplified electric signals provided by the integrating amplifier 113. The reading circuit 112 further includes a multiplexer 115 configured to convert the electric signals output in parallel from the sample-and-hold circuits into a series electric signal, and an analog-to-digital converter 116 configured to convert the output electric signal into digital data. A reference potential Vref is supplied from a power supply circuit 119 to a non-inverting input terminal of the reading circuit 112.

The power supply circuit 119 is also electrically connected to a plurality of bias lines 106 arranged in the row direction via a common bias line 117 and a third connection line 118 to supply a bias potential Vs or an initialization potential Vr to the second electrodes 102 of the respective conversion elements 104.

Next, an operation of the radiation detection apparatus according to the present embodiment is described below with reference to FIG. 2A. The reference potential Vref is applied to the first electrode 103 of the conversion element 104 via the switch element and the bias potential Vs is applied to the second electrode 102 thereby biasing the conversion element 104 such that a photoelectric conversion layer of the MIS-type photoelectric conversion element is depleted. In this state, the radiation emitted toward an object under examination passes through the object while attenuating in intensity, and is converted into visible light by a fluorescent element (not shown). The resultant visible light is incident on the photoelectric conversion element and is converted into an electric charge. The electric signal corresponding to the electric charge is output over the signal line 108 when the switch element 105 turns on in response to the driving pulse applied from the driving circuit 110 to the driving line 107, and the electric signal is read out as digital data by the reading circuit 112.

Thereafter, the potential of the bias line 106 is changed from the bias potential Vs to the initialization potential Vr to turn on the switch element 105 thereby removing positive or negative residual carriers from the photoelectric conversion element. Thereafter, the potential of the bias line 106 is changed from the initialization potential Vr to the bias potential Vs to complete the initialization of the conversion element 104.

Figure 2B:
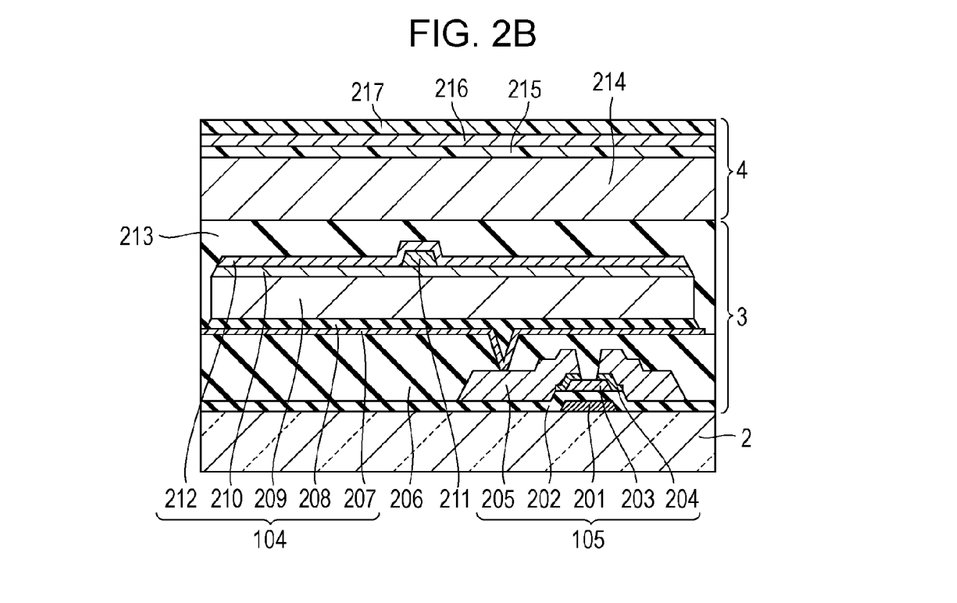

Next, referring to FIG. 2B, a cross-sectional structure of one pixel is described below. The TFT serving as the switch element 105 includes a first conductive layer 201, a first insulating layer 202, a first semiconductor layer 203, a first impurity semiconductor layer 204, and a second conductive layer 205, formed on the first surface of the substrate 2.

The first conductive layer 201 is used as a control electrode (gate electrode) of the TFT, and the first insulating layer 202 is used as a gate insulating film of the TFT. The first semiconductor layer 203 serves as a channel, the first impurity semiconductor layer 204 serves as an ohmic contact layer, and the second conductive layer 205 serves as a first or second main electrode (source or drain electrode) of the TFT.

At an upper layer level, a second insulating layer 206 is disposed as an interlayer insulating layer. As for the second insulating layer, an organic insulating film, an inorganic insulating film, or a multilayer structure thereof may be used. More specifically, a multilayer structure including an inorganic insulating film serving as a passivation film covering the TFT and an organic insulating film serving as a planarization film may be used.

On the second insulating layer 206, the photoelectric conversion element 104 is formed. The photoelectric conversion element 104 includes a third conductive layer 207, a third insulating layer 208, a second semiconductor layer 209, a second impurity semiconductor layer 210, and a fifth conductive layer 212. The third conductive layer 207 serves as a lower electrode (first electrode 103) of the photoelectric conversion element 104. The third insulating layer 208 serves as a perfect insulating layer for blocking generated positive and negative carriers from moving. The second semiconductor layer 209 serves as a photoelectric conversion layer that converts radiation or light into an electric charge.

The second impurity semiconductor layer 210 serves as a blocking layer that blocks positive or negative carriers from moving. The fifth conductive layer 212 serves as an upper electrode (second electrode 102). The fourth conductive layer 211 serves as the bias line 106. The upper electrode (second electrode 102) serves to apply a bias voltage to the whole conversion elements 104, wherein the bias voltage is equal to the difference between the bias potential Vs or the initialization potential Vr supplied via the bias line 106 and a reference potential Vref supplied to the first electrode 103.

As described above, the switch element 105 and the photoelectric conversion element 104 are disposed on the first surface of the substrate 2 in a stacked manner. At a further upper layer level, a fourth insulating layer 213 serving as both a passivation film and a planarization layer as with the second insulating layer 206 is disposed. One pixel is formed by these elements described above.

The photoelectric conversion unit 3 is formed in the multilayer structure including various conductive or insulating layers described above such as the first conductive layer and the fourth insulating layer 213. The scintillator 4 is firmly disposed on the first surface of the photoelectric conversion unit 3. The scintillator 4 includes a fluorescent layer 214, a fluorescent layer protecting layer 215, a reflective layer 216, and a support element 217. The fluorescent layer 214 is for converting radiation into visible light with a wavelength in a range detectable by the photoelectric conversion element. The fluorescent layer 214 is formed on the first surface of the photoelectric conversion unit 3 by evaporation or the fluorescent layer 214 is firmly bonded to the first surface of the photoelectric conversion unit 3 via an adhesive.

The fluorescent layer protecting layer 215 is for protecting the fluorescent layer 214 from water or a mechanical impact. The fluorescent layer protecting layer 215 may be made of an organic resin. The reflective layer 216 is for reflecting visible light emitted by the fluorescent layer 214 in a direction toward the photoelectric conversion unit 3. The reflective layer 216 may be made of a metallic material such as aluminum highly transparent to radiation and highly reflective to light. The reflective layer 216 may be applied with a fixed potential such that it serves as an electromagnetic shield. The support element 217 is for ensuring high rigidity of reflective layer 216 and protecting the fluorescent layer 214 and the reflective layer 216. The support element 217 may be an organic resin sheet such as a PET (polyethylene terephthalate) sheet.

The scintillator 4 is fixed to the support base 9 such that the surface of the scintillator 4 on which the support element 217 is disposed is in contact with the support base 9.

Figure 3A:
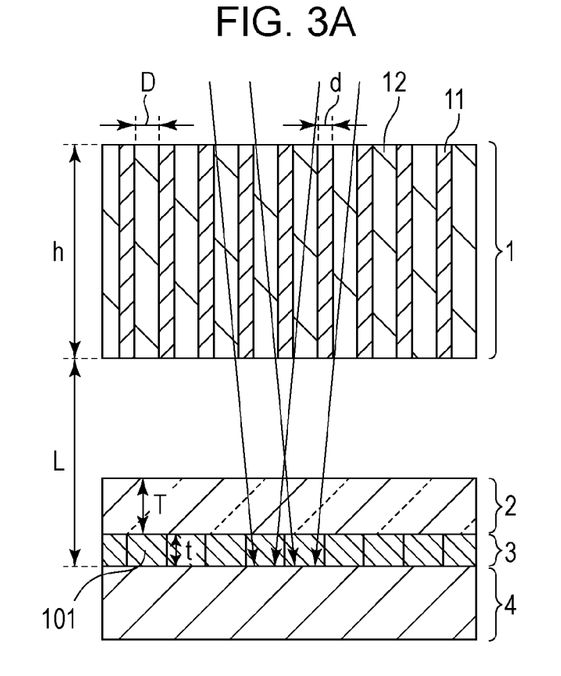
FIGS. 3A and 3B are cross-sectional views illustrating concepts of an embodiment of the present invention.

Next, referring to FIGS. 3A and 3B, an explanation is given below as to a dependence of a blur of radiation detection apparatus on the distance L from the first surface of the anti-scatter grid 1 for removing scattered radiation to the second surface of the scintillator 4.

The grid 1 includes radiation-absorptive members (Pb) 11 and radiation-transmissive members (Al) 12 alternately arranged in the form of slits or a matrix. The anti-scatter grid 1 may be formed according to the JIS standard Z4910. FIG. 3A illustrates a conventional grid for comparison with the grid 1 according to the present embodiment. In a conventional apparatus, the grid is normally placed outside the cover 5 serving as a housing, and thus the distance L between the first surface of the grid and the second surface of the scintillator 4 is as large as 10 to 20 mm. In such a structure, in proportion to the distance L, the shift increases between where the non-linear radiation is incident on the grid and where the radiation is incident on the scintillator 4 after it passes through the grid. In the example shown in FIG. 3A, a shift of one pixel occurs between the position where non-linear radiation is incident on the grid and the position where the non-linear radiation is incident on the second surface of the scintillator 4, and this shift can cause a blur of an image detected by the radiation detection apparatus. The amount of the blur increases as the grid ratio of the grid 1 decreases and as the distance L between the first surface of the grid 1 and the second surface of the scintillator 4 increases.

Figure 3B:
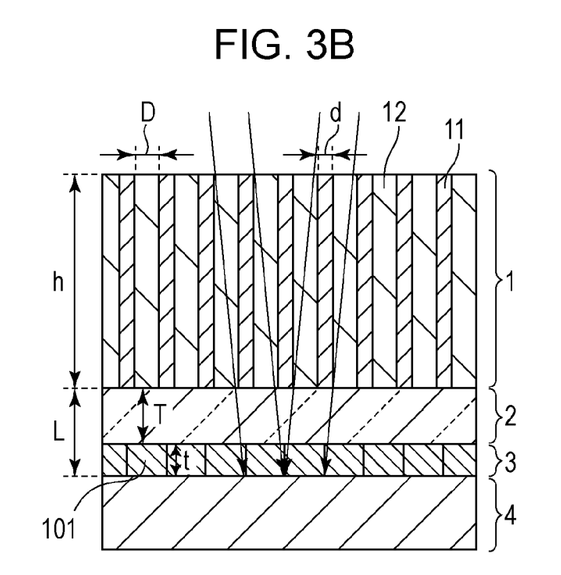

In contrast, in the structure shown in FIG. 3B according to the present embodiment of the invention, the grid 1 is disposed so as to minimize the distance L between the first surface of the grid 1 and the second surface and the scintillator 4. This reduces the shift to a smaller level less than one pixel between where non-linear radiation is incident on the grid 1 and where the non-linear radiation is incident on the scintillator 4 after the radiation passes through the grid 1. To reduce the influence of scattered radiation, it is effective to reduce the distance between an object to be detected and the scintillator 4. From this point of view, the reduction in the distance between the grid 1 and the scintillator 4 results in an essential reduction in blur of the image due to scattered radiation. In the present embodiment of the invention, to reduce the distance L, the first surface of the grid 1 may be in direct contact with the second surface of the substrate 2. In this case, the distance L can be reduced to a value equal to the sum of the thickness of the substrate 2 and the thickness of the photoelectric conversion unit 3. To achieve a small value for the distance L, for example, a glass substrate with a thickness of 0.5 to 1.5 mm may be used as the substrate 2. It is possible to further reduce the distance L by reducing the thickness of the glass substrate from 1.0 mm or the like to 0.1 mm to 0.5 mm by performing a thinning process such as etching or lapping on the glass substrate. The distance L is preferable to be less than 2 mm.

When the thickness of the substrate 2 is smaller than the thickness h of the grid 1, it is not easy for scattered radiation, after having passed through the grid 1, to be incident on a different pixel adjacent to the correct pixel 101 on the second surface of the scintillator 4, and thus it is possible to minimize or prevent reduction in the MTF.

When D denotes the space between each two adjacent radiation-absorptive members 11 between which there is one of the radiation-transmissive members 12, and d denotes the thickness of each radiation-absorptive member 11, the thickness of the substrate 2 may be set to be less than the grid size (D+d). When the radiation detection apparatus is used in mammography, capturing of an image is performed using a low tube voltage such as 30 KeV or less. This results in an increase in the amount of radiation absorbed by the substrate 2. Therefore, by limiting the thickness of the substrate 2 to the range described above, it becomes possible to achieve a high-sensitivity detection of a clear image with a reduced blur.

Although there are many types of grids 1, it is difficult to change the thickness of the substrate 2 depending on the type of the grid 1. In view of the above, the thickness of the substrate 2 may be set to be approximately equal to or less than the pixel pitch P of the photoelectric conversion element to reduce the blur. When T denotes the thickness of the substrate 2 and t denotes the thickness of the photoelectric conversion unit 3, the distance L may be set so as to satisfy a condition described below by a mathematical expression.

$$t+T<L<4\times P\times r=4\times P\times h/D$$

where the grid ratio r is given by h/D, and the grid density N is given by 1/(d+D). The grid ratio r is mostly in a range of 4 to 10. In the following explanation, by way of example, the grid ratio r is assumed to be equal to 5. The grid density N is mostly in a range of 30 to 60 (1/cm). In the following explanation, by way of example, the grid density N is assumed to be equal to 40 (1/cm).

In general, the radiation detection apparatus is designed to be capable of detecting an object with a size about 4 times the pixel pitch P. In this regard, the grid 1 may be designed so as to prevent scattered radiation with a shift 4 times the pixel pitch P from being incident on the scintillator 4. This can be achieved by satisfying a following condition described below by a mathematical expression:

$$t+T<L<4\times P\times r=4\times P\times h/D$$

For example, for the radiation detection apparatus in which the pixel pitch P is 160 μm, the distance L may be set to be less than 3.2 mm.

Next, referring to FIGS. 3A and 3B and FIGS. 4A and 4B, a description is given below as to a process of producing the radiation detection apparatus according to the present embodiment of the invention.

Figure 4A:
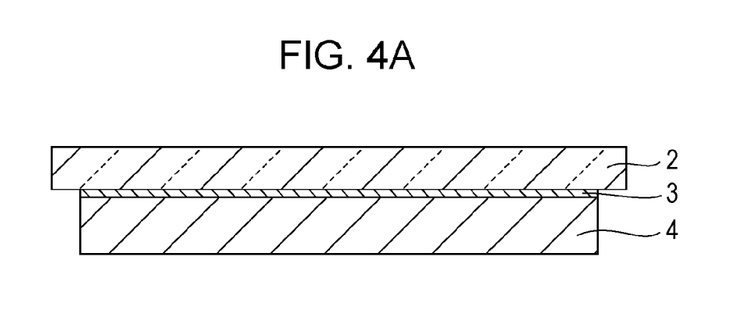
FIGS. 4A and 4B are cross-sectional views illustrating a production process of a radiation detection apparatus according to an embodiment of the present invention.

First, as shown in FIG. 4A, the photoelectric conversion unit 3 is formed on the first surface of the substrate 2, and the scintillator 4 is then formed on the first surface of the photoelectric conversion unit 3. In this process, the substrate material may be subjected to the thinning process as described above to obtain the substrate 2.

Figure 4B:
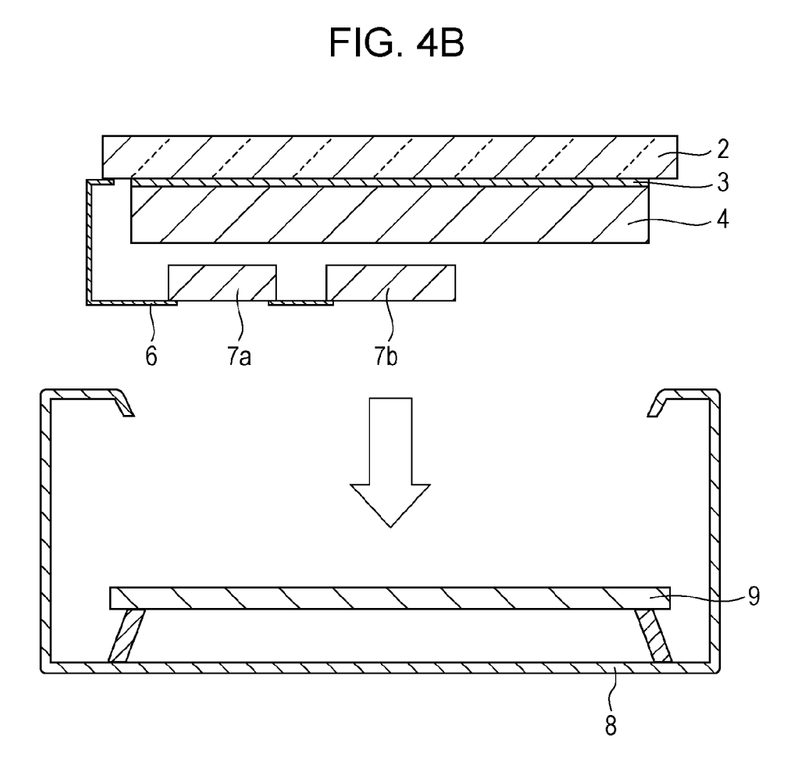

Next, as shown in FIG. 4B, after a flexible wiring board 6 connected to a printed circuit board 7a and the like is connected to an end of the first surface of the substrate 2, the first surface of the scintillator 4 is fixed to the support base 9 disposed in the enclosure case 8. An adhesive, a mordant, a shock absorber, or the like may be disposed between the support base 9 and the first surface of the scintillator 4 as required.

Figure 5A:
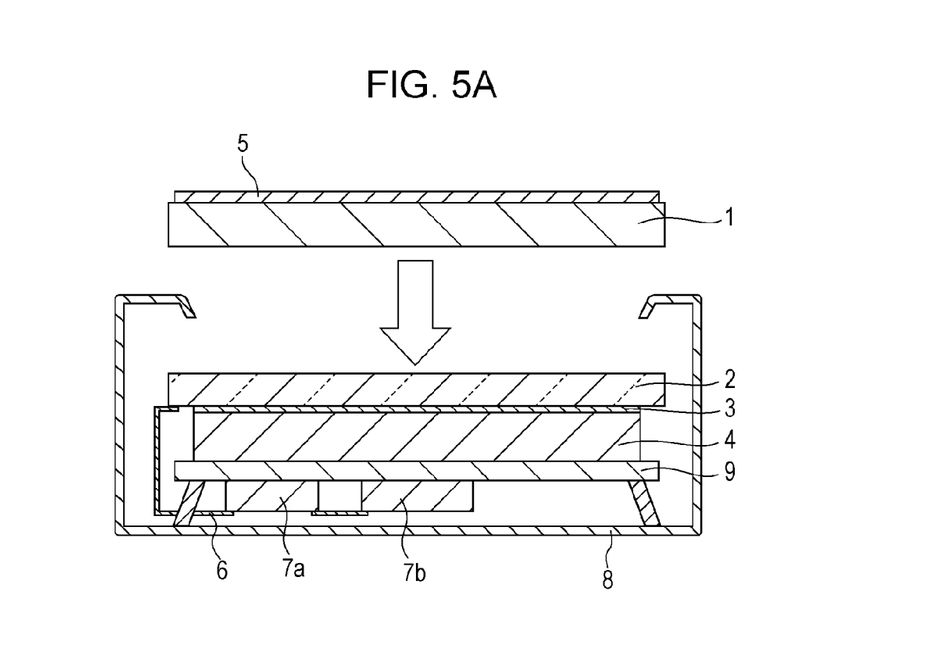
FIGS. 5A and 5B are cross-sectional views illustrating a production process of a radiation detection apparatus, and more particularly, a process of installing an anti-scatter grid, according to an embodiment of the present invention.

Next, referring to FIGS. 5A and 5B, a description is given below as to a process of installing the grid 1 and the cover 5, in the process of forming the radiation detection apparatus. In the present embodiment, different two methods described below with reference to FIGS. 5A and 5B may be employed to install the grid 1 and the cover 5. In the method shown in FIG. 5 A, the grid 1 and the cover 5 is placed on the second surface of the substrate 2 such that the grid 1 and the cover 5 are fit in the enclosure case 8 and such that the enclosure case 8 is closed by the grid 1 and the cover 5. The structure may be configured such that when the enclosure case 8 is closed, the cover 5 and the grid 1 are pressed down. In this structure, the grid 1 is fixed firmly and closely to the second surface of the substrate 2, which ensures high strength against sudden falling or a mechanical impact.

The second surface of the substrate 2 and the grid 1 are, at least partially, in close contact with the each other, and this makes it possible to reduce the distance between the first surface of the grid 1 and the second surface of the scintillator 4. The second surface of the substrate 2 may be formed by coating the substrate material with a soft thin film material so that no problem occurs even if there is a solid foreign particle between the substrate 2 and the grid 1. In this case, an organic insulating film such as PET (polyethylene terephthalate), PI (polyimide), or the like may be used as the thin film material.

Figure 5B:
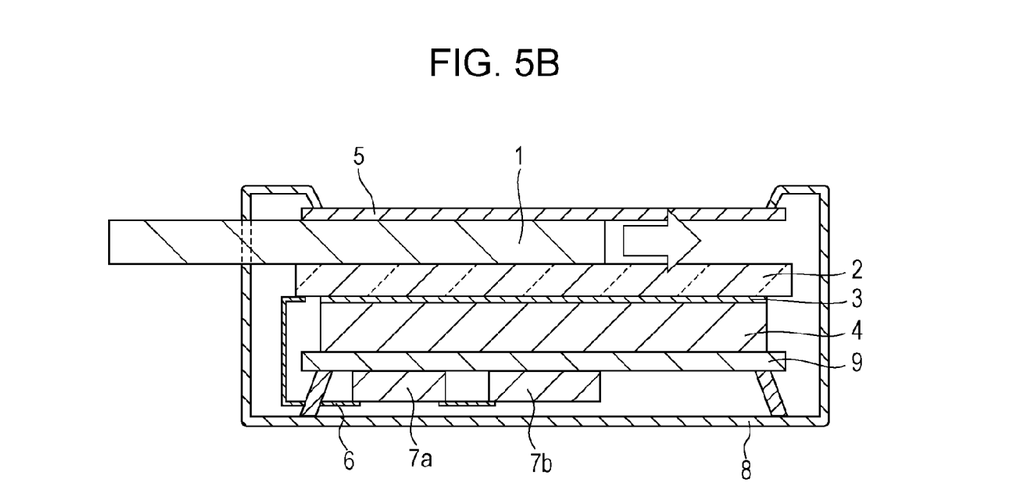

In the method shown in FIG. 5B, after the cover 5 is connected to the enclosure case 8 so as to form the housing, the grid 1 is inserted into the housing via an insertion slot formed on a side face of the enclosure case 8. The insertion slot is normally closed. In the closed state, no external light can be incident on the inside of the housing. In this structure, the second surface of the substrate 2 may be formed using a material with high slipperiness such as a silicon oxide film, a silicon nitride film, or the like. In a case where there is a possibility that the grid 1 is rubbed and damaged by the substrate 2, guide rails may be provided on the enclosure case 8 or on the second surface of the substrate 2 in regions outside the photoelectric conversion unit 3, and the grid 1 may be installed by sliding the grid 1 over the guide rails such that the grid 1 is located close to the substrate 2 whereby a robust structure can be achieved. When the grid 1 is placed in a final position after it is transported along the guide rails, the grid 1 may be pressed such that the grid 1 is brought into contact with the second surface of the substrate 2.

The anti-scatter grids are generally classified into two types: parallel grids and focused grids. When a focused grid is used, the focusing distance of the focused grid is changed depending on the distance between an object and a tube serving as a point radiation source. The grid may vary in grid density or grid ratio depending on a specific application in which the radiation detection apparatus is used. Therefore, the grid 1 may be removable although it is brought into close contact with the second surface of the substrate 2 when it is used. For this purpose, it can be beneficial to employ the structure in which the insertion slot is formed on the side face of the enclosure case 8 such that the grid 1 can be inserted via the insertion slot. This structure allows it to change the grid depending on the application in which the radiation detection apparatus is used.

Although it is assumed in the present embodiment that the photoelectric conversion element is of the MIS type, the photoelectric conversion element is not limited to the MIS-type photoelectric conversion element, but other types of photoelectric conversion elements such as a PIN-type photodiode may be used. Furthermore, although the TFT is used as the switch element in the present embodiment, the switch element is not limited to the TFT but other switch elements such as a switching diode, which can be produced using a thin film semiconductor process, may be used. Materials usable for switch elements produced by the thin film semiconductor process include amorphous silicon, polysilicon, etc.

Second Embodiment

Figure 6:
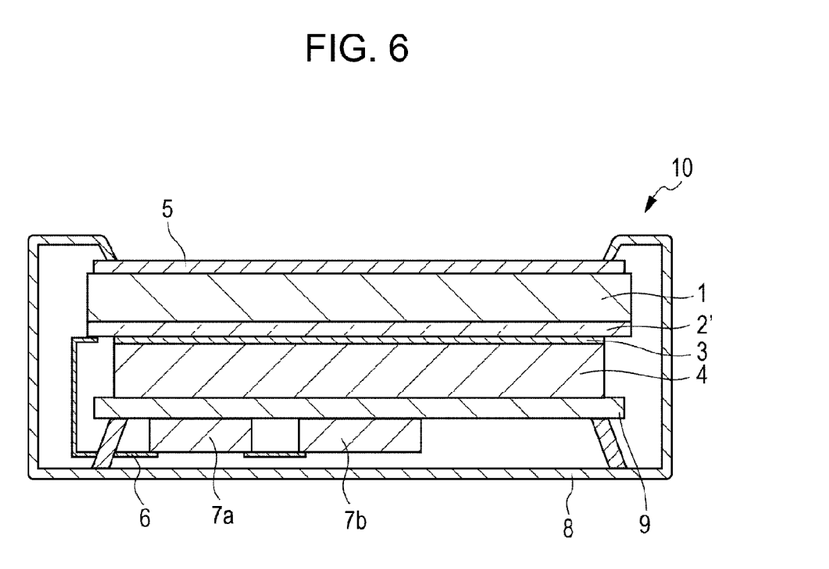
FIG. 6 is a cross-sectional view illustrating a radiation detection apparatus according to an embodiment of the present invention.

Next, referring to FIG. 6, a second embodiment of a radiation detection apparatus 10 according the present invention is described below. The radiation detection apparatus 10 of the second embodiment is different from that of the first embodiment in that a substrate 2' is used instead of the substrate 2. Other elements are similar to those according to the first embodiment, and thus a further detailed explanation thereof is omitted.

In the present embodiment, the substrate 2' is a resin substrate made of an acrylic resin, a siloxane-based resin, a polyimide resin, or the like resistant to a high processing temperature at which the photoelectric conversion unit 3 is formed. More specifically, the substrate 2' may be produced by first forming a resin substrate on a substrate material having a high rigidity such as a glass substrate, then forming the photoelectric conversion unit 3 thereon, and finally removing the substrate material. The thickness of the substrate 2' may be set to be as small as 5 to 50 μm, and the anti-scatter grid 1 may be disposed on the substrate 2' such that the second surface of the substrate 2' is in close contact with the first surface of the anti-scatter grid 1. This makes it possible to achieve a small distance between the second surface of the scintillator 4 and the first surface of the anti-scatter grid 1, and thus it is possible to improve the MTF. Furthermore, because the substrate 2' can be formed to be as small as 5 to 50 μm in thickness, substantially no radiation is absorbed by the substrate 2'. This results in an increase in sensitivity. However, the small thickness of the substrate 2' makes it difficult for the substrate 2' itself to have sufficiently high rigidity, and thus it is difficult to form the photoelectric conversion unit 3 on the substrate 2'. Therefore, the substrate 2' is first formed on the substrate material having a high rigidity, and then photoelectric conversion unit 3 is formed thereon, and finally the substrate material is removed, whereby the apparatus shown in FIG. 6 is obtained. By employing an acrylic resin, a siloxane-based resin, a polyimide resin, or the like having high resistance to high temperatures as the material for the substrate 2', it becomes possible to form the photoelectric conversion unit 3 at a rather high temperature of 150 to 300° C. using a thin film semiconductor process.

Next, referring to FIGS. 7A to 7F, a description is given below as to a process of producing the substrate 2', the photoelectric conversion unit 3, and the scintillator 4 according to the present embodiment of the invention.

Figure 7A:
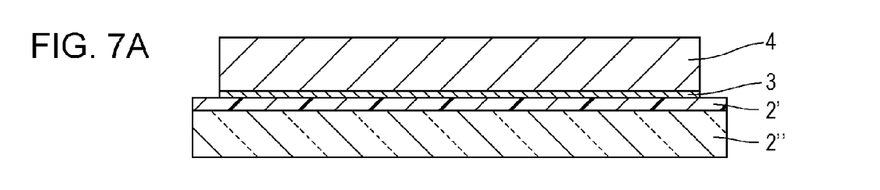
FIGS. 7A to 7E are cross-sectional views illustrating part of a process of producing a radiation detection apparatus according to an embodiment of the present invention.
Figure 7B:
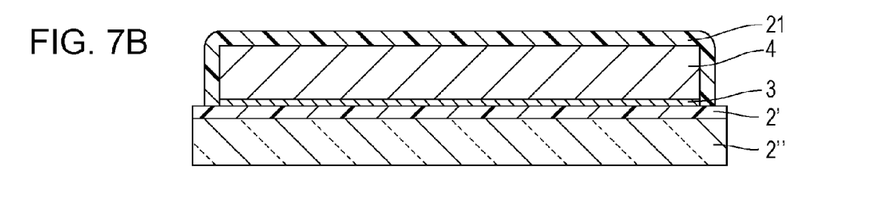

First, as shown in FIG. 7A, a substrate 2' is formed of an acrylic resin on a substrate material 2" such as a glass substrate. The photoelectric conversion unit 3 is then formed on a surface, which will become the first surface, of the substrate 2' using a thin film semiconductor process. Thereafter, the scintillator 4 is placed on the first surface of the photoelectric conversion unit 3. Next, as shown in FIG. 7B, a resist 21 is coated or bonded such that the scintillator 4 and at least a peripheral area of the first surface of the substrate 2' surrounding the photoelectric conversion unit 3 are covered by the resist 21. This resist 21 is for protecting the scintillator 4 and the photoelectric conversion unit 3 when the substrate 2' is removed from the substrate material 2", and the resist 21 does not remain in the apparatus after the process is complete. Therefore, various kinds of materials may be used for the resist 21 as long as the materials can work for the protection.

Figure 7C:
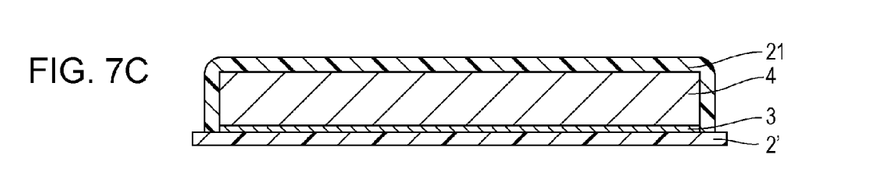

Next, as shown in FIG. 7C, the substrate material 2" is removed from the substrate 2'. One method of removing the substrate material 2" is to immerse the composition shown in FIG. 7C in an etchant that can etch the substrate material 2" but does not etch the resist 21 and the substrate 2'. Another method is to, in the process shown in FIG. 7A, bond the substrate 2' to the substrate material 2" using an adhesive removable, for example, by UV radiation, remove the substrate material 2" from the substrate 2' by exposing the adhesive to the UV radiation. In the state in which the substrate material 2" has been removed from the substrate 2', the substrate 2' by itself alone cannot have a sufficiently high rigidity. However, the rigidity of the scintillator 4 can provide a high mechanical strength of the composition.

Figure 7D:
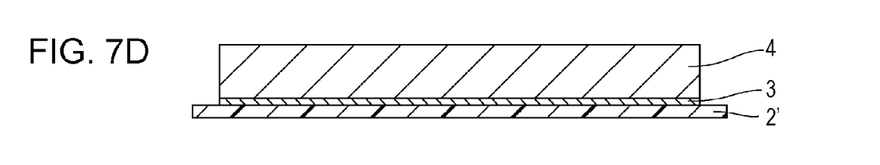

Next, as shown in FIG. 7D, the resist 21 is removed from the composition produced in FIG. 7C. A method of removing the resist 21 is to resolve the resist 21 using an alkali agent. Another method is to peel off the resist 21 in the form of a sheet. In the method of peeling off the resist 21, if the rigidity of the scintillator 4 alone cannot provide a high enough rigidity to withstand the process of peeling off the resist 21, the scintillator 4 may be placed on a metal stage or the like firmly by vacuum chucking or the like, and then the resist 21 may be peeled off while maintaining the state in which the sufficiently high rigidity is achieved.

Figure 7E:
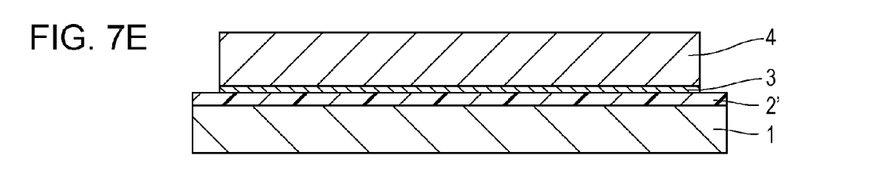

Next, as shown in FIG. 7E, the grid 1 is bonded or firmly connected to the second surface of the substrate 2' such that the grid 1 is in close contact with the second surface of the substrate 2'. As a result, the substrate 2' and the photoelectric conversion unit 3 are disposed between the two rigid elements, i.e., the scintillator 4 and the grid 1. Thus, a high mechanical strength is achieved for the resultant composition.

Third Embodiment

Figure 8:
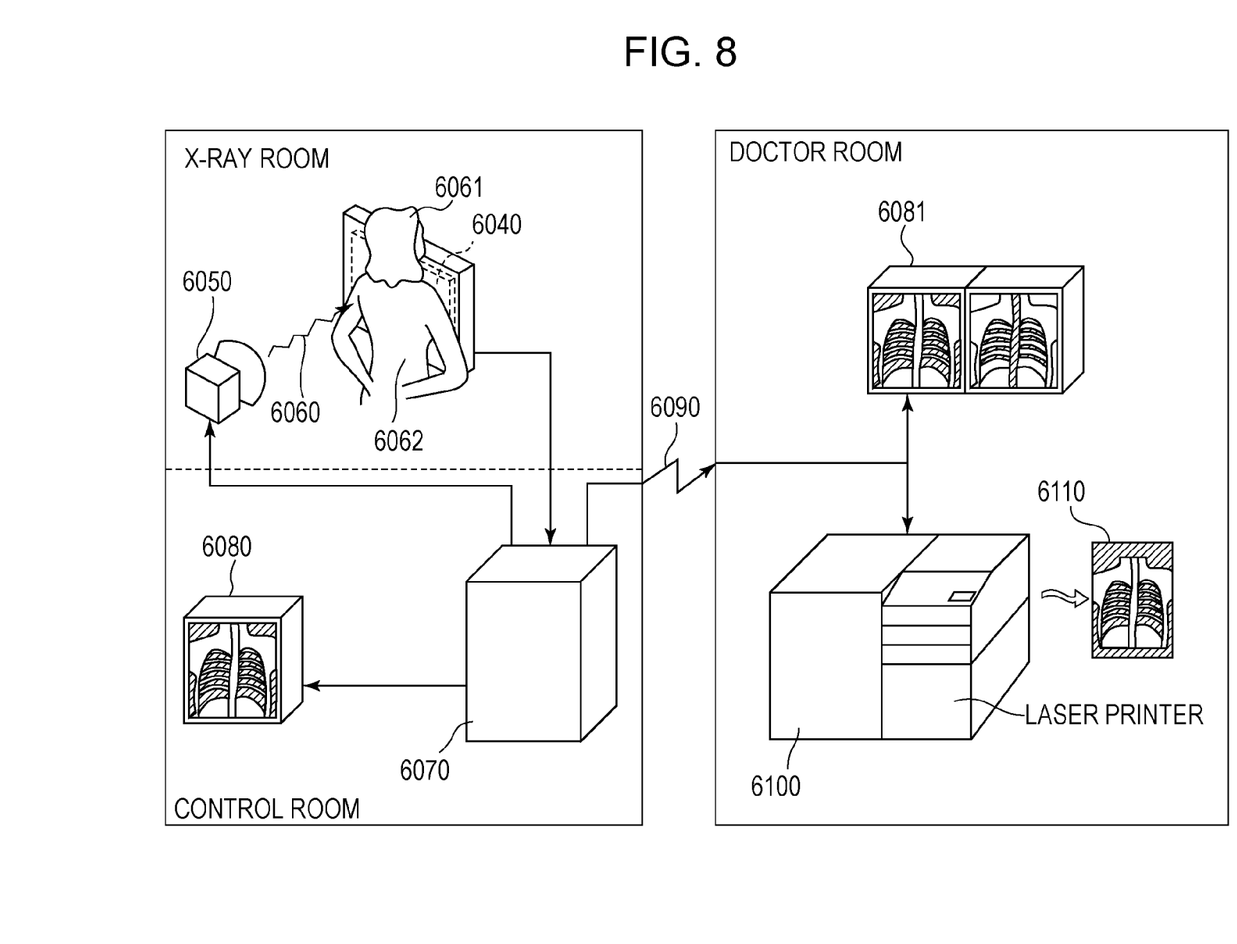
FIG. 8 is a diagram illustrating a radiation detection system using a radiation detection apparatus according to an embodiment of the present invention.

Referring to FIG. 8, a radiation detection system using a radiation detection apparatus according to an embodiment of the present invention is described below. An X-ray 6060 generated by an X-ray tube 6050 serving as a radiation source passes through a chest 6062 of a patient or a subject 6061 and is incident on a radiation detection apparatus 6040 including the photoelectric conversion unit 3 and the scintillator 4 disposed on the first surface of the photoelectric conversion unit 3. The incident X-ray includes information on the inside of the body of the patient 6061. In response to the incident X-ray, the scintillator 4 emits light. The emitted light is converted into electric information by the photoelectric conversion unit 3. The electric information is converted into a digital signal and is subjected to image processing by an image processor 6070 serving as a signal processing unit. A resultant image and information related thereto are displayed on a display 6080 serving as a display unit installed in a control room. The obtained image and information related thereto may be transferred to a remote location by a transmitting unit via a telephone line 6090 or the like. In this manner, the image and information related thereto may be displayed on a display 6081 serving as a display unit installed in a doctor room at the remote location or it may be stored in a storage medium such as an optical disk. This allows a doctor at the remote location to make a diagnosis. The information may be recorded on a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-260523 filed Nov. 22, 2010, which is hereby incorporated by reference herein in its entirety.

What is claimed is:

1. A radiation detection apparatus comprising:
    a scintillator configured to convert incident radiation into visible light;
    a photoelectric conversion unit including a plurality of pixels arranged in a two-dimensional array on a substrate, each pixel configured to convert the visible light into an electric signal; and
    a grid for removing scattered radiation including radiation-absorptive members and radiation-transmissive members arranged alternately,
    wherein the grid, the substrate, the photoelectric conversion unit, and the scintillator are disposed in this order from a radiation-incident side of the radiation detection apparatus to an opposite side thereof, the photoelectric conversion unit is disposed on a surface of the substrate opposite to a surface on which the radiation is incident, and
    wherein the grid is disposed such that the grid is at least partially in contact with the radiation-incident surface of the substrate or such that the grid is bonded to the radiation-incident surface of the substrate.

2. The radiation detection apparatus according to claim 1, wherein, when L denotes the distance between the surface of the grid opposite to a radiation-incident surface thereof and the radiation-incident surface of the scintillator, the distance L satisfies a condition represented by a following mathematical expression: t+T L 4×P×h/D where h denotes the thickness of the grid, D denotes the space between each two adjacent radiation-absorptive members in which one of the radiation-transmissive members is disposed, T denotes the thickness of the substrate, t denotes the thickness of the photoelectric conversion unit, and P denotes the pixel pitch of pixels.

3. The radiation detection apparatus according to claim 2, wherein the substrate has a surface formed by a thinning process applied to a side on which the radiation is incident, and wherein the thickness T of the substrate is 0.1 to 0.5 mm.

4. The radiation detection apparatus according to claim 1, further comprising a housing in which the substrate, the photoelectric conversion unit, the scintillator, and the grid are disposed.

5. The radiation detection apparatus according to claim 4, wherein the housing includes an enclosure case and a cover, the enclosure case including a support base that supports the scintillator such that a surface opposite to a radiation-incident surface thereof is fixed to the support base, the cover disposed on a radiation-incident side of the enclosure case,
    wherein a printed circuit board is connected to an end of the substrate via a flexible wiring board, the printed circuit board including a control circuit disposed thereon to control at least one of a driving circuit for controlling the photoelectric conversion unit and a reading circuit for reading an electric signal from the photoelectric conversion unit, and wherein the printed circuit board is disposed on a side, opposite to a radiation-incident side, of the support base.

6. The radiation detection apparatus according to claim 5, wherein the scintillator includes a fluorescent layer disposed on a radiation-incident side of the scintillator and configured to convert the radiation into the visible light, and a protective element disposed on a side, opposite to the radiation-incident side, of the scintillator and configured to protect the fluorescent layer, and wherein the surface of the scintillator, on which the protective element is disposed, is fixed to the support base.

7. A radiation detection system comprising:

the radiation detection apparatus according to claim 1;

a signal processing unit configured to process a signal from the radiation detection apparatus;

a storage unit configured to store a signal supplied from the signal processing unit;

a display unit configured to display the signal supplied from the signal processing unit; and a transmitting unit configured to transmit the signal supplied from the signal processing unit.

* * * * *